United States Patent
Jang et al.

(10) Patent No.: US 8,884,339 B2
(45) Date of Patent: *Nov. 11, 2014

(54) SEMICONDUCTOR DEVICE WITH BUMP FORMED ON SUBSTRATE TO PREVENT ELK ILD DELAMINATION DURING REFLOW PROCESS

(71) Applicant: STATS ChipPAC, Ltd., Singapore (SG)

(72) Inventors: KiYoun Jang, Kyoungki-Do (KR); DaeSik Choi, Seoul (KR); OhHan Kim, Kyonggi-Do (KR); DongSoo Moon, Kyonggi-Do (KR)

(73) Assignee: STATS ChipPAC, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/906,844

(22) Filed: May 31, 2013

(65) Prior Publication Data
US 2013/0264705 A1    Oct. 10, 2013

Related U.S. Application Data

(60) Continuation of application No. 13/691,427, filed on Nov. 30, 2012, now Pat. No. 8,519,536, which is a division of application No. 12/764,805, filed on Apr. 21, 2010, now Pat. No. 8,367,467.

(51) Int. Cl.
H01L 23/48 (2006.01)

(52) U.S. Cl.
USPC ............ 257/237; 257/762; 257/778; 257/780

(58) Field of Classification Search
USPC ................. 257/737–738, 762, 779–780, 778, 257/E21.506, E23.01, E21.509; 438/106–108, 612–615
See application file for complete search history.

(56) References Cited

U.S. PATENT DOCUMENTS

| | | | |
|---|---|---|---|
| 5,192,835 A | 3/1993 | Bull et al. | |
| 5,334,804 A | 8/1994 | Love et al. | |
| 5,532,612 A | 7/1996 | Liang | |
| 6,369,451 B2 | 4/2002 | Lin | |
| 6,681,982 B2 | 1/2004 | Tung | |
| 6,864,168 B2 | 3/2005 | Chen et al. | |
| 7,034,391 B2 * | 4/2006 | Pendse | 257/691 |
| 7,476,564 B2 | 1/2009 | Chen et al. | |
| 7,569,935 B1 | 8/2009 | Fan | |
| 7,579,848 B2 | 8/2009 | Bottoms et al. | |
| 7,605,480 B2 * | 10/2009 | Pendse | 257/778 |
| 7,700,407 B2 * | 4/2010 | Pendse | 438/107 |

(Continued)

*Primary Examiner* — Dung A. Le
(74) *Attorney, Agent, or Firm* — Robert D. Atkins; Patent Law Group: Atkins and Associates, P.C.

(57) ABSTRACT

A semiconductor device that has a flipchip semiconductor die and substrate. A first insulating layer is formed over the substrate. A via is formed through the first insulating layer. Conductive material is deposited in the via to form a conductive pillar or stacked stud bumps. The conductive pillar is electrically connected to a conductive layer within the substrate. A second insulating layer is formed over the first insulating layer. Bump material is formed over the conductive pillar. The bump material is reflowed to form a bump. The first and second insulating layers are removed. The semiconductor die is mounted to the substrate by reflowing the bump to a conductive layer of the die. The semiconductor die also has a third insulating layer formed over the conductive layer and an active surface of the die and UBM formed over the first conductive layer and third insulating layer.

29 Claims, 8 Drawing Sheets

(56) References Cited

U.S. PATENT DOCUMENTS

| | | |
|---|---|---|
| 7,790,504 B2 * | 9/2010 | Ramakrishna et al. ....... 438/109 |
| 7,847,417 B2 | 12/2010 | Araki et al. |
| 8,519,536 B2 * | 8/2013 | Jang et al. .................... 257/737 |
| 2005/0017355 A1 | 1/2005 | Chou et al. |
| 2009/0014852 A1 * | 1/2009 | Lee ................................ 257/676 |
| 2009/0020322 A1 | 1/2009 | Hsu |
| 2010/0314161 A1 | 12/2010 | Oh et al. |
| 2011/0058346 A1 * | 3/2011 | Lee et al. ...................... 361/783 |
| 2011/0272450 A1 * | 11/2011 | Gruber et al. .................. 228/18 |

* cited by examiner

SEMICONDUCTOR DEVICE WITH BUMP FORMED ON SUBSTRATE TO PREVENT ELK ILD DELAMINATION DURING REFLOW PROCESS

CLAIM TO DOMESTIC PRIORITY

The present application is a continuation of U.S. patent application Ser. No. 13/691,427, now U.S. Pat. No. 8,519,536, filed Nov. 30, 2012, which is a division of U.S. patent application Ser. No. 12/764,805, now U.S. Pat. No. 8,367,467, filed Apr. 21, 2010, which applications are incorporated herein by reference.

FIELD OF THE INVENTION

The present invention relates in general to semiconductor devices and, more particularly, to a semiconductor device and method of forming a bump on a substrate to prevent ELK ILD delamination during the reflow process.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Figure 1A:
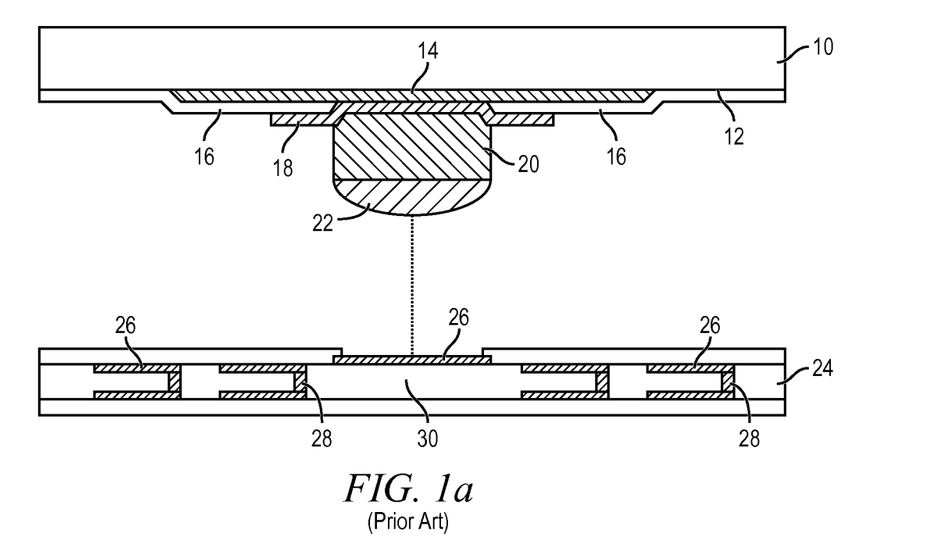
FIGS. 1a-1b illustrate a conventional bumped flipchip semiconductor die mounted to a substrate.

FIG. 1a shows a conventional flipchip type semiconductor die 10 with active surface 12. Semiconductor die 10 is originally formed on a wafer. An electrically conductive layer 14 is formed over active surface 12. Conductive layer 14 provides electrical interconnect for the circuits on active surface 12. A passivation layer 16 is formed over active surface 12 and conductive layer 14. An under bump metallization (UBM) 18 is formed over conductive layer 14 and passivation layer 16. A conductive pillar 20 is formed over UBM 18 and a solder cap is formed over conductive pillar 20. The solder cap is reflowed to form a rounded solder bump 22, typically while semiconductor die 10 is in wafer form.

Figure 1B:
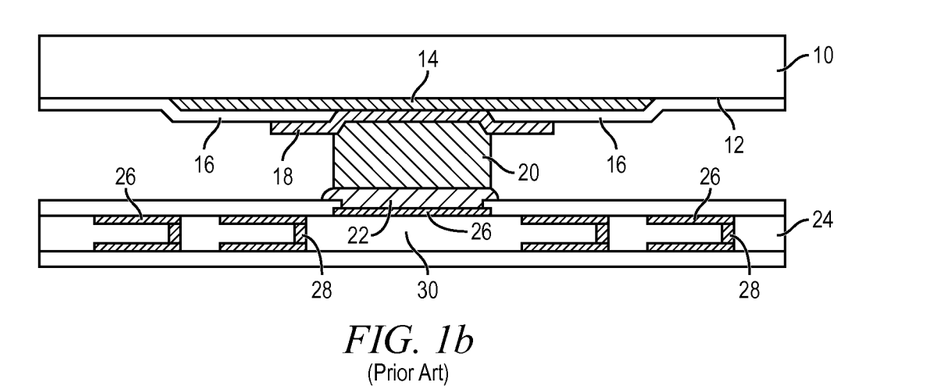

Substrate 24 includes horizontal conductive layers 26 and vertical conductive layers 28 formed within insulating or dielectric material 30. Bump 22 is aligned with conductive layer 26 to mount semiconductor die 10 to substrate 24. Bump 22 is brought into contact with conductive layer 26 and reflowed to metallurgically and electrically connect the bump to the conductive layer, as shown in FIG. 1b. Substrate 24 provides structural support and electrical interconnect for semiconductor die 10.

The bumped semiconductor die 10 has a problem with delamination or damage of the extremely-low dielectric constant (ELK) interlayer dielectric layer (ILD) around bump area. When the semiconductor wafer is subjected to thermal stress during the reflow process, the ELK ILD delamination or damage can occur which causes defects in the semiconductor die.

SUMMARY OF THE INVENTION

A need exists to reduce ELK ILD delamination or damage around the bump area during a wafer-level reflow process. Accordingly, in one embodiment, the present invention is a method of making a semiconductor device comprising the steps of providing a substrate, forming an interconnect structure over the substrate including a portion extending into the substrate, and disposing a semiconductor die over the substrate and electrically connected to the interconnect structure.

In another embodiment, the present invention is a method of making a semiconductor device comprising the steps of providing a substrate, and forming an interconnect structure over the substrate including a non-fusible portion extending into the substrate and fusible portion disposed over the non-fusible portion.

In another embodiment, the present invention is a semiconductor device comprising a substrate and interconnect structure formed over the substrate including a non-fusible portion extending into the substrate and fusible portion disposed over the non-fusible portion.

In another embodiment, the present invention is a semiconductor device comprising a substrate and interconnect structure disposed over the substrate including a portion extending into the substrate.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along nonfunctional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
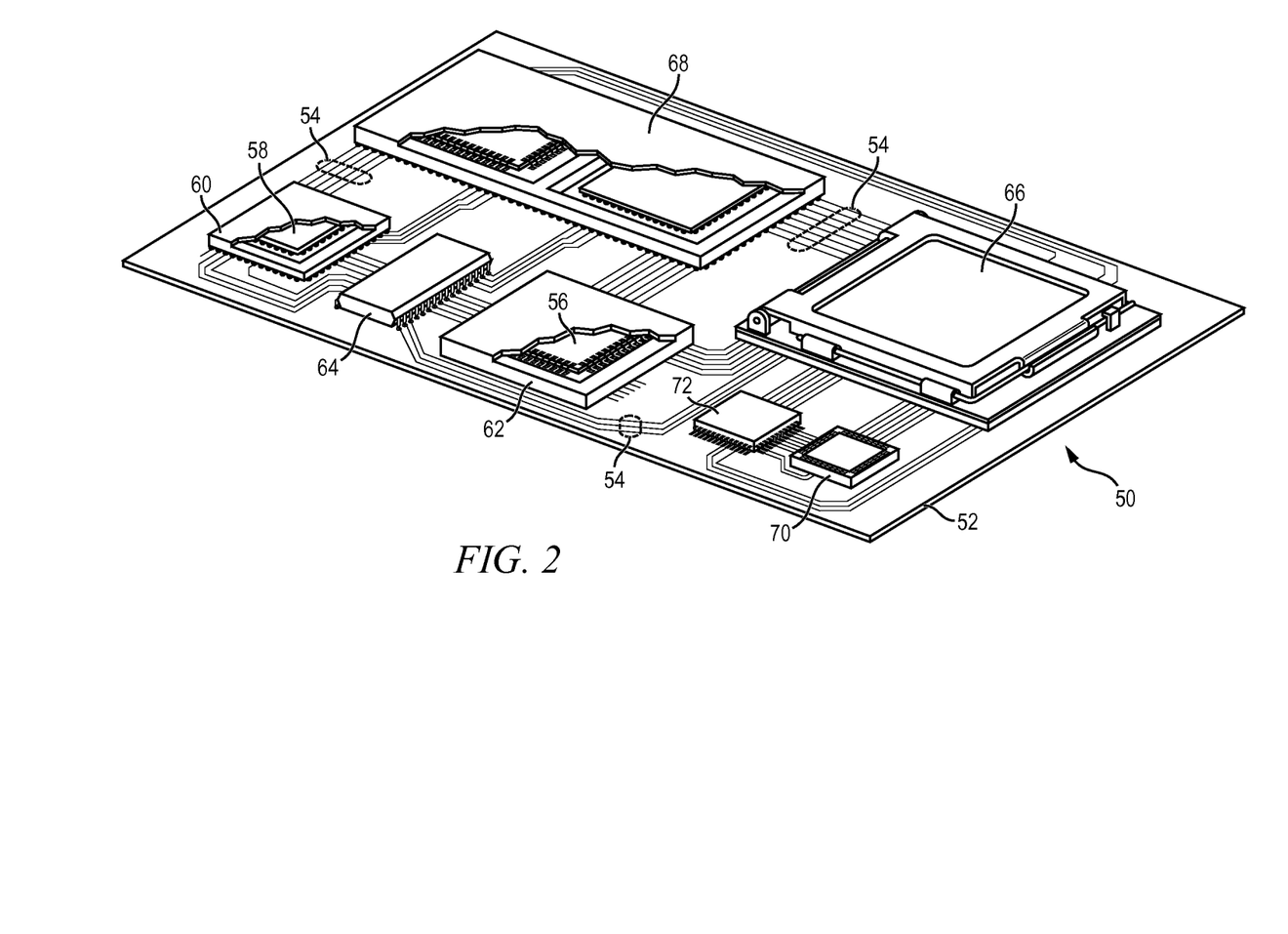
FIG. 2 illustrates a PCB with different types of packages mounted to its surface.

FIG. 2 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 2 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
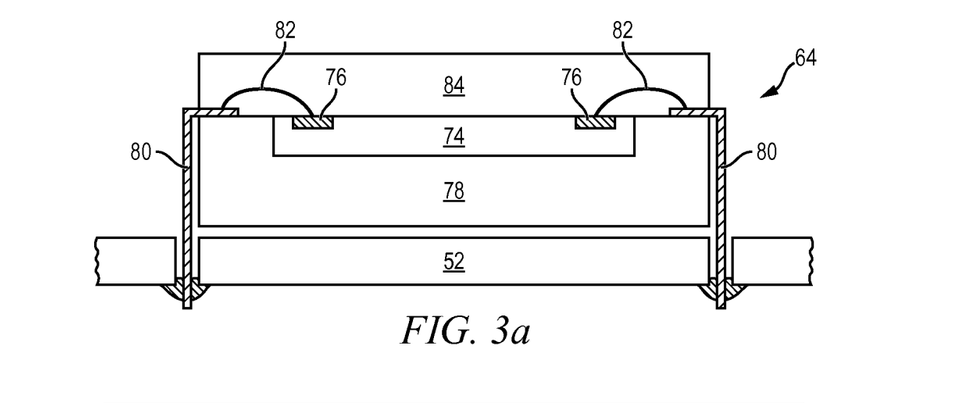
FIGS. 3a-3c illustrate further detail of the representative semiconductor packages mounted to the PCB.
Figure 3B:
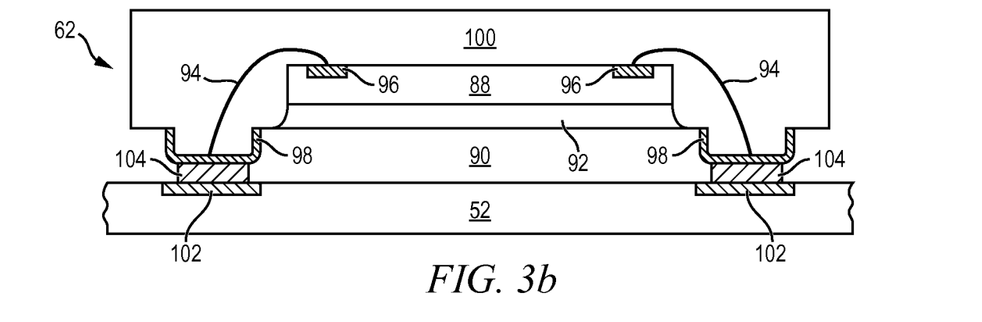
Figure 3C:
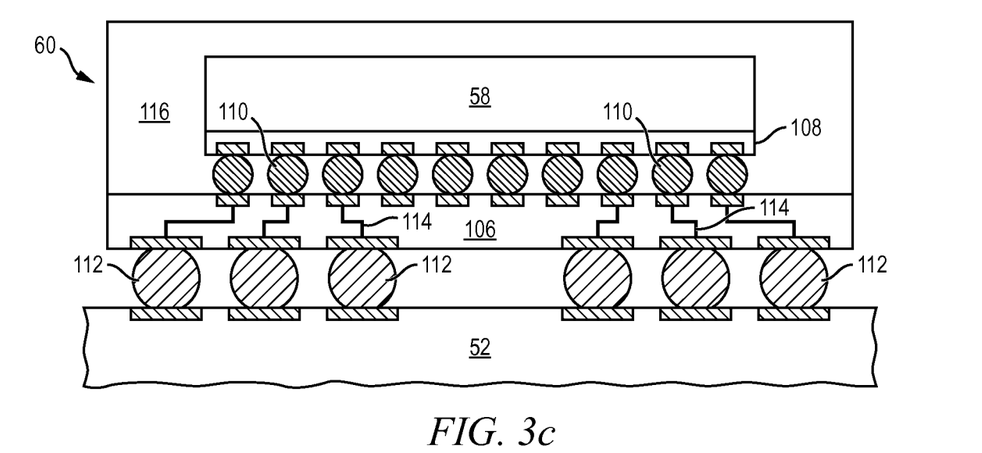

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 3b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 4A:
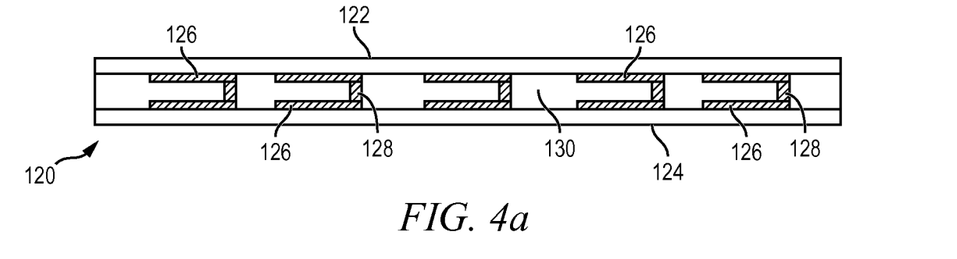
FIGS. 4a-4j illustrate a process of forming a bump on a substrate with two insulating layers to prevent ELK ILD delamination during reflow.

FIGS. 4a-4j illustrate, in relation to FIGS. 2 and 3a-3c, a process of forming a bump on a substrate to prevent ELK ILD delamination during the reflow process. FIG. 4a shows a substrate 120 having top surface 122 and opposing bottom surface 124. Substrate 120 includes horizontal conductive layers 126 and vertical conductive layers 128 formed within insulating or dielectric material 130. Substrate 120 provides structural support and electrical interconnect through conductive layers 126 and 128 for a semiconductor die.

Figure 4B:
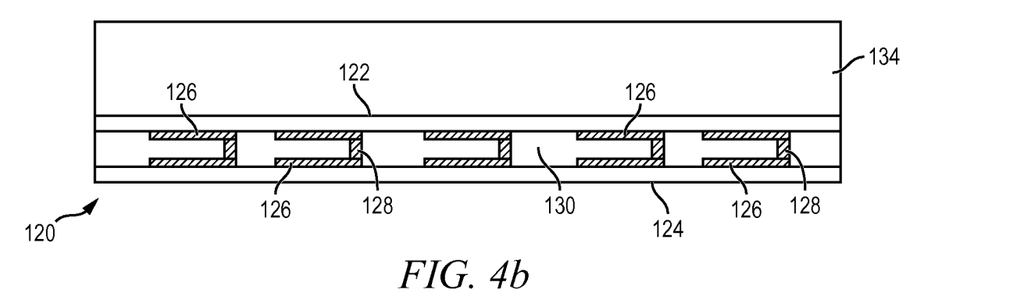

In FIG. 4b, an insulating or photoresist layer 134 is formed over top surface 122 of substrate 120 using PVD, CVD, printing, spin coating, spray coating, or thermal oxidation. The insulating layer 134 can be one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. Alternatively, the photoresist can be a liquid or dry film.

Figure 4C:
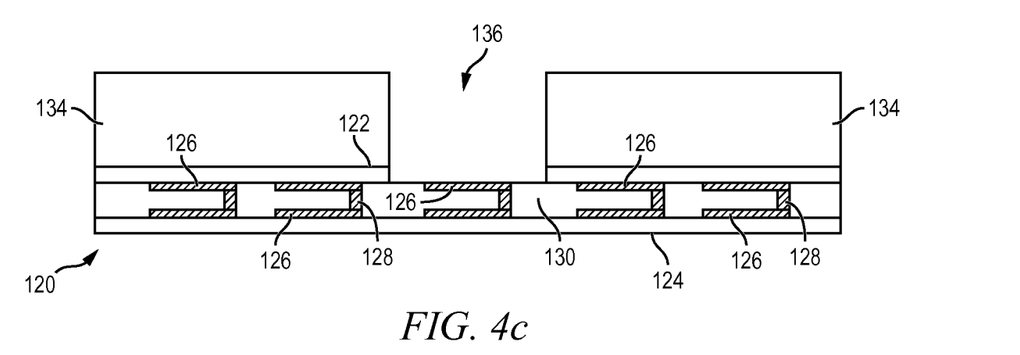

In FIG. 4c, a portion of insulating layer 134, as well as a portion of insulating material 130 from substrate 120, is patterned using photolithography and removed by an etching process to form via 136. The via 136 extends through insulating layers 130 and 134 and exposes conductive layer 126 within substrate 120.

Figure 4D:
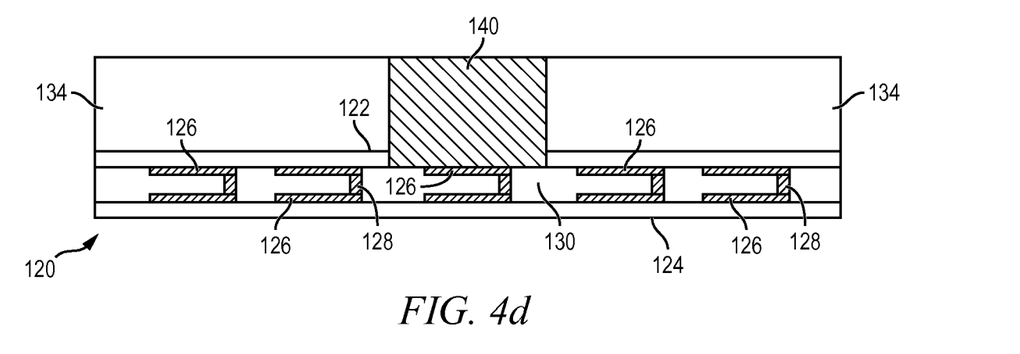
Figure 4E:
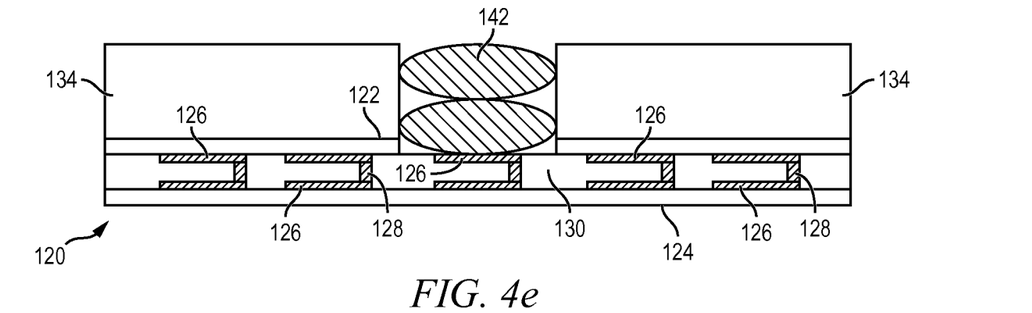

In FIG. 4d, an electrically conductive material, such as Cu, Al, W, Au, or other suitable material is deposited in via 136 by an electrolytic plating or electroless plating process to form conductive pillar 140. In one embodiment, conductive pillar 140 has a height of 10-100 micrometers (μm). Conductive pillar 140 represents one type of electrical interconnect that can be formed in via 136. Alternatively, a plurality of stacked stud bumps 142 can be formed in via 136, as shown in FIG. 4e.

Figure 4F:
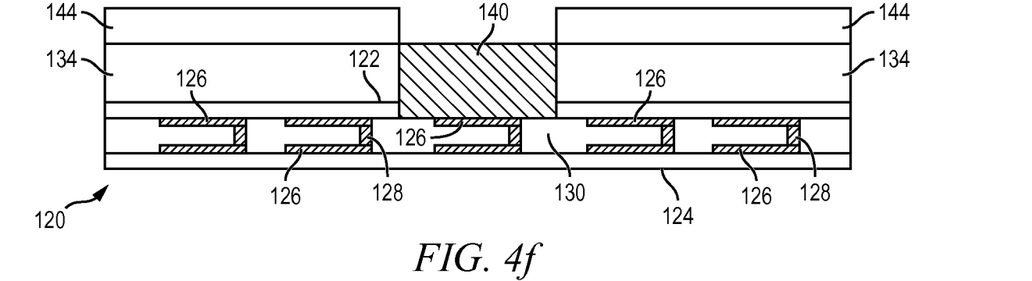

In FIG. 4f, an insulating or photoresist layer 144 is formed over insulating layer 134 using PVD, CVD, printing, spin coating, spray coating, or thermal oxidation. The insulating layer 144 can be one or more layers of SiO2, Si3N4, SiON, Ta2O5, Al2O3, or other material having similar insulating and structural properties. Alternatively, the photoresist can be a liquid or dry film. A portion of insulating layer 144 over conductive pillar 140 is patterned and removed by an etching process to expose the conductive pillar.

Figure 4G:
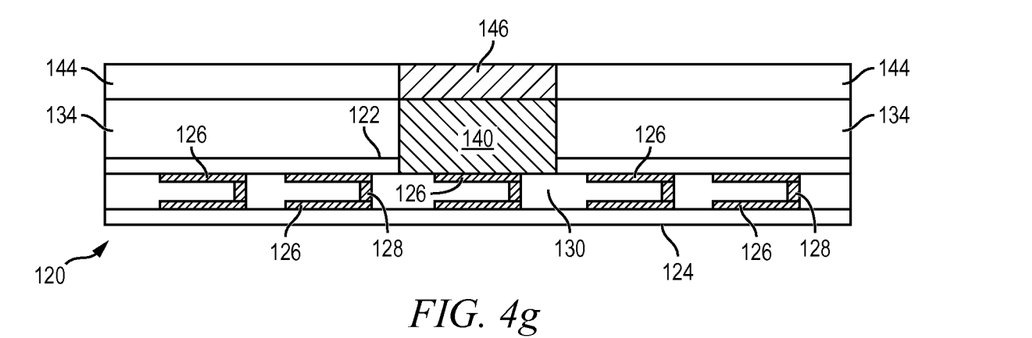

In FIG. 4g, an electrically conductive bump material 146 is deposited over the exposed conductive pillar 140 using an evaporation, electrolytic plating, electroless plating, ball drop, or screen printing process. Bump material 146 can be Al, Sn, Ni, Au, Ag, Pb, Bi, Cu, solder, and combinations thereof, with an optional flux solution. For example, bump material 146 can be eutectic Sn/Pb, high-lead solder, or lead-free solder.

Figure 4H:
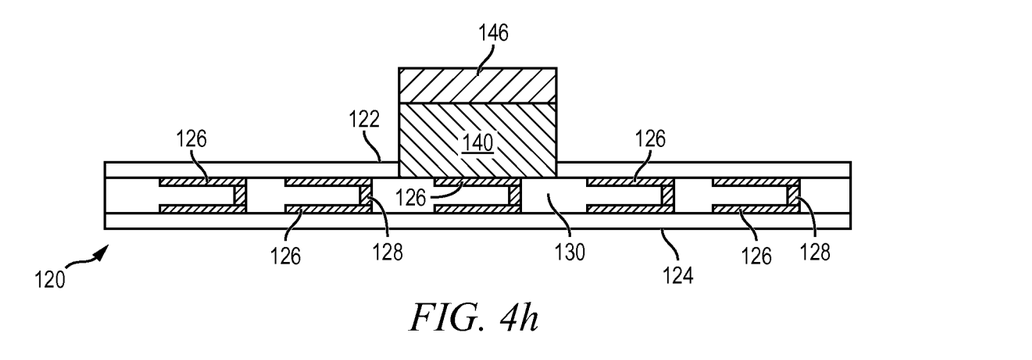
Figure 4I:
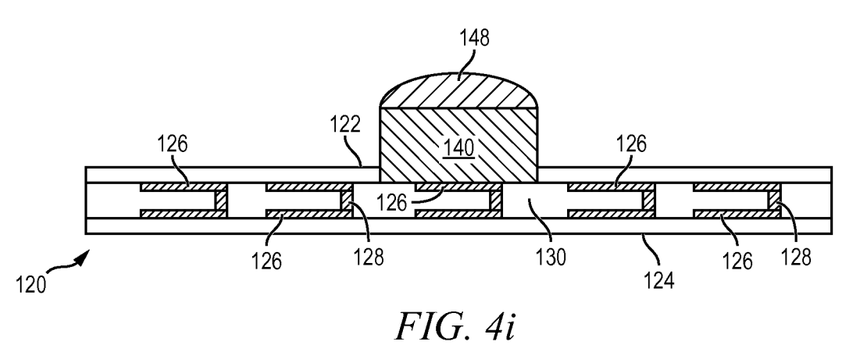

In FIG. 4h, insulating layers 134 and 144 are stripped away leaving behind conductive pillar 140 with bump material 146. Bump material 146 is bonded to conductive pillar 140 using a suitable attachment or bonding process. In one embodiment, the bump material 146 is reflowed by heating the material above its melting point to form rounded bump 148, as shown in FIG. 4i. In some applications, bump 148 is reflowed a second time to improve electrical contact to conductive pillar 140. Bump 148 can also be compression bonded to conductive pillar 140.

Figure 4J:
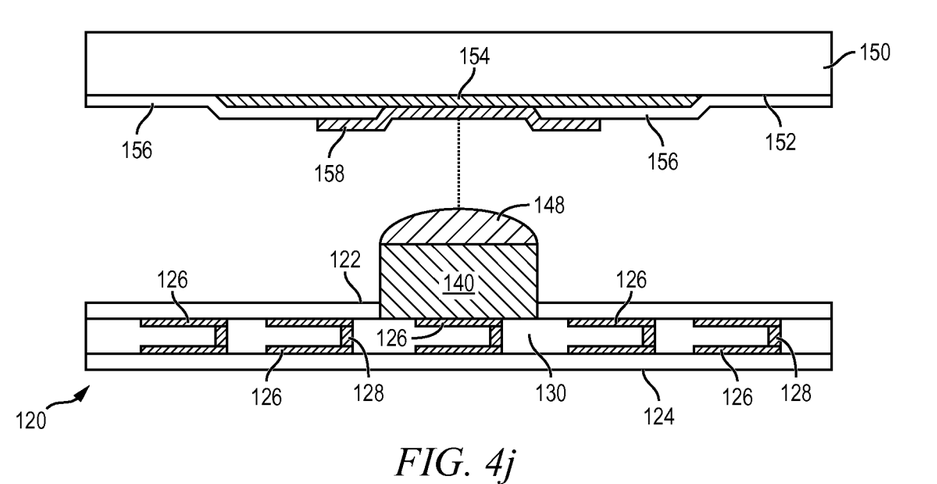

In FIG. 4j, semiconductor die 150 is shown with active surface 152 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 152 to implement analog circuits or digital circuits, such as digital signal processor (DSP), ASIC, memory, or other signal processing circuit. Semiconductor die 150 may also contain IPDs, such as inductors, capacitors, and resistors, for RF signal processing. In one embodiment, semiconductor die 150 is a flipchip type semiconductor die. Semiconductor die 150 is formed on a semiconductor wafer.

An electrically conductive layer 154 is formed over active surface 152 using PVD, CVD, electrolytic plating, electroless plating process, or other suitable metal deposition process. Conductive layer 154 can be one or more layers of Al, Cu, Sn, Ni, Au, Ag, or other suitable electrically conductive material. Conductive layer 154 provides electrical interconnect for the circuits on active surface 152.

An insulating or passivation layer 156 is formed over active surface 152 and conductive layer 154 using PVD, CVD, printing, spin coating, spray coating, or thermal oxidation. The insulating layer 156 can be one or more layers of SiO2, Si3N4, SiON, Ta2O5, Al2O3, or other material having similar insulating and structural properties. A portion of insulating layer 156 over conductive layer 154 is patterned and removed by an etching process to expose the conductive layer.

An electrically conductive layer 158 is formed over the exposed portion of conductive layer 154 using PVD, CVD, evaporation, electrolytic plating, electroless plating, or other suitable metal deposition process. Conductive layer 158 can be Al, Cu, Sn, Ni, Au, Ag, tungsten (W), or other suitable electrically conductive material. Conductive layer 158 is a UBM electrical connected to conductive layer 154. UBMs 158 can be a multi-metal stack with adhesion layer, barrier layer, and seed or wetting layer. The adhesion layer is formed over conductive layer 154 and can be titanium (Ti), titanium nitride (TiN), titanium tungsten (TiW), Al, or chromium (Cr). The barrier layer is formed over the adhesion layer and can be Ni, NiV, platinum (Pt), palladium (Pd), TiW, or chromium copper (CrCu). The barrier layer inhibits the diffusion of Cu into the active area of the die. The seed layer is formed over the barrier layer and can be Cu, Ni, NiV, Au, or Al. UBMs 158 provide a low resistive interconnect to conductive layer 154, as well as a barrier to solder diffusion and seed layer for solder wettability.

Figure 5:
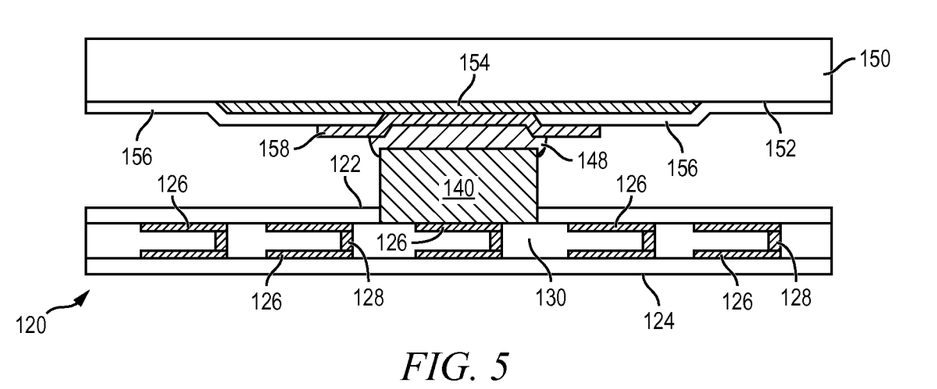
FIG. 5 illustrates the semiconductor die bonded to the bump formed on the substrate.

Note that semiconductor die 150 has no conductive pillar or bump formed on UBM 158, as described in the background. Instead, using the process and structure described in FIGS. 4a-4j, conductive pillar 140 and bump 148 are formed over substrate 120 and provide the electrical interconnect needed to bond semiconductor die 150 to the substrate. UBM 158 is aligned with bump 148 to mount semiconductor die 150 to substrate 120. UBM 158 is brought into contact with bump 148 and reflowed to metallurgically and electrically connect the UBM to the bump. FIG. 5 shows semiconductor die 150 mounted to substrate 120 with UBM 158 bonded to bump 148. Since semiconductor die 150 is mounted to substrate 120 without forming bumps on the wafer or die, i.e., without subjecting the wafer to thermal stress during reflow, the ELK ILD delamination or damage around the bump area of the wafer or die is avoided.

Figure 6A:
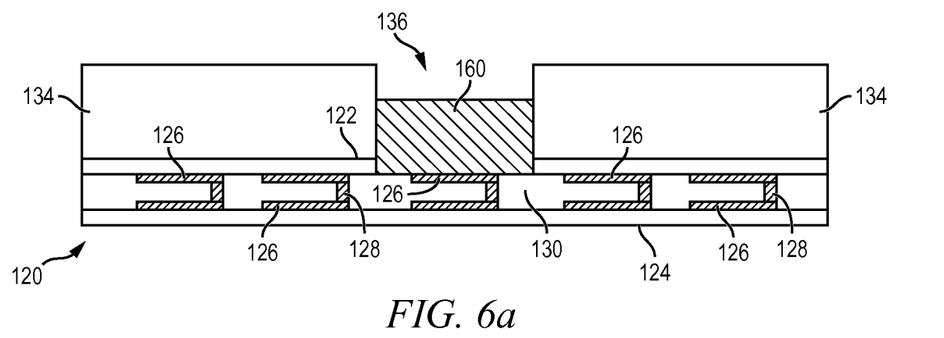
FIGS. 6a-6e illustrate a process of forming a bump on a substrate with one insulating layer.

In another embodiment, continuing from FIG. 4c, an electrically conductive material, such as Cu, Al, W, Au, or other suitable material is deposited in via 136 by an electrolytic plating or electroless plating process to form conductive pillar 160, as shown in FIG. 6a. Conductive pillar 160 does not completely fill via 136. The top portion of via 136 is reserved for bump material. In one embodiment, conductive pillar 160 has a height of 10-100 μm. Conductive pillar 160 represents one type of electrical interconnect that can be formed in via 136. Alternatively, a plurality of stacked stud bumps can be formed in via 136.

Figure 6B:
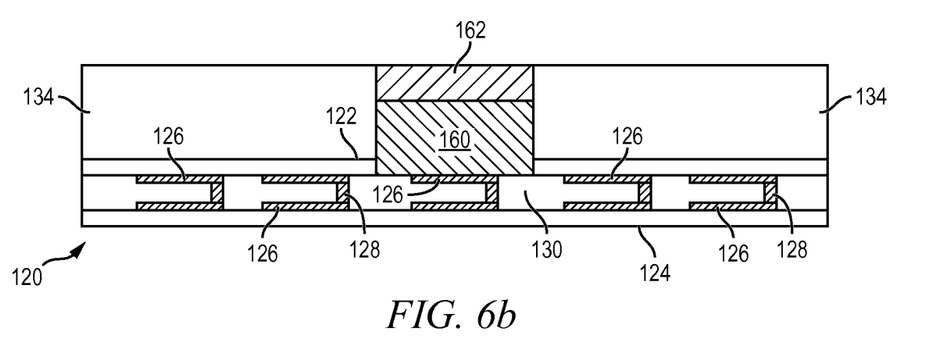

In FIG. 6b, an electrically conductive bump material 162 is deposited in via 136 over conductive pillar 160 using an evaporation, electrolytic plating, electroless plating, ball drop, or screen printing process. Bump material 162 can be Al, Sn, Ni, Au, Ag, Pb, Bi, Cu, solder, and combinations thereof, with an optional flux solution. For example, bump material 162 can be eutectic Sn/Pb, high-lead solder, or lead-free solder.

Figure 6C:
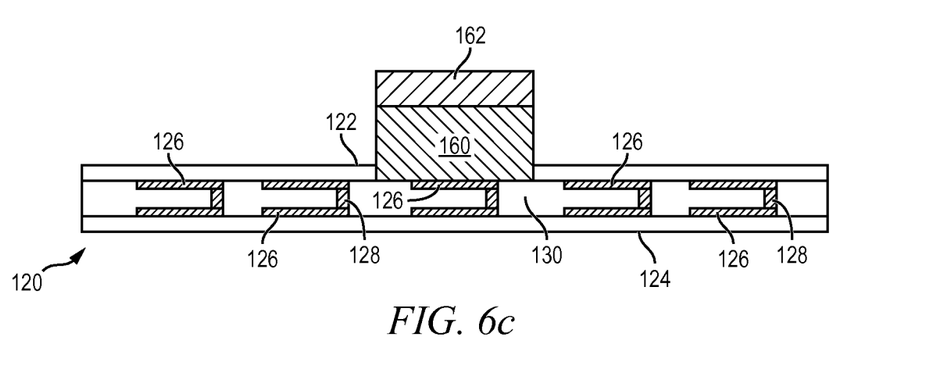
Figure 6D:
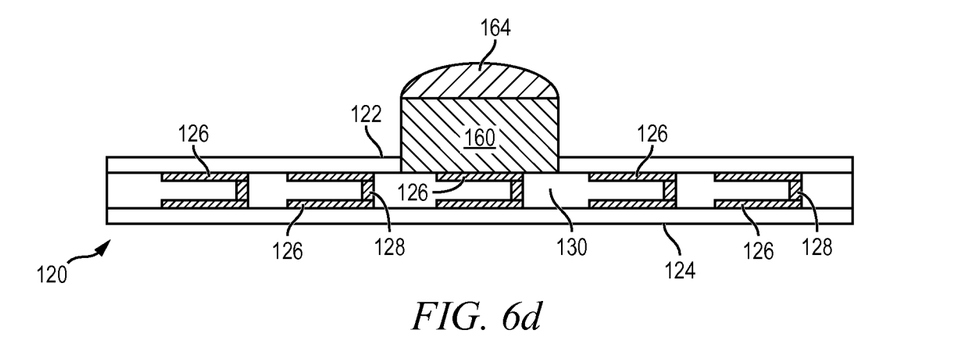

In FIG. 6c, insulating layer 134 is stripped away leaving behind conductive pillar 160 with bump material 162. Bump material 162 is bonded to conductive pillar 160 using a suitable attachment or bonding process. In one embodiment, the bump material 162 is reflowed by heating the material above its melting point to form rounded bump 164, as shown in FIG. 6d. In some applications, bump 164 is reflowed a second time to improve electrical contact to conductive pillar 160. Bump 164 can also be compression bonded to conductive pillar 160.

Figure 6E:
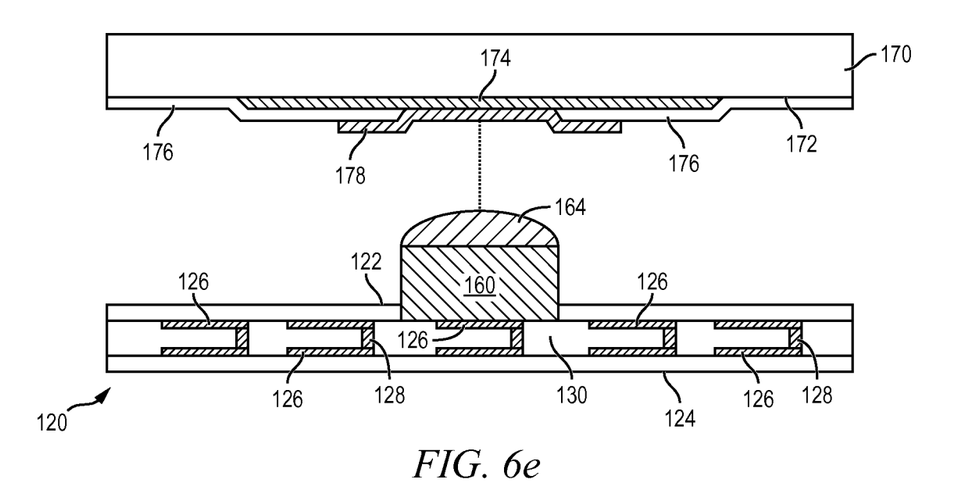

In FIG. 6e, semiconductor die 170 is shown with active surface 172 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 172 to implement analog circuits or digital circuits, such as DSP, ASIC, memory, or other signal processing circuit. Semiconductor die 170 may also contain IPDs, such as inductors, capacitors, and resistors, for RF signal processing. In one embodiment, semiconductor die 170 is a flipchip type semiconductor die. Semiconductor die 170 is formed on a semiconductor wafer.

An electrically conductive layer 174 is formed over active surface 172 using PVD, CVD, electrolytic plating, electroless plating process, or other suitable metal deposition process. Conductive layer 174 can be one or more layers of Al, Cu, Sn, Ni, Au, Ag, or other suitable electrically conductive material. Conductive layer 174 provides electrical interconnect for the circuits on active surface 172.

An insulating or passivation layer 176 is formed over active surface 172 and conductive layer 174 using PVD, CVD, printing, spin coating, spray coating, or thermal oxidation. The insulating layer 176 can be one or more layers of SiO2, Si3N4, SiON, Ta2O5, Al2O3, or other material having similar insulating and structural properties. A portion of insulating layer 176 over conductive layer 174 is patterned and removed by an etching process to expose the conductive layer.

An electrically conductive layer 178 is formed over the exposed portion of conductive layer 174 using PVD, CVD, evaporation, electrolytic plating, electroless plating, or other suitable metal deposition process. Conductive layer 178 can be Al, Cu, Sn, Ni, Au, Ag, W, or other suitable electrically conductive material. Conductive layer 178 is a UBM electrical connected to conductive layer 174. UBMs 178 can be a multi-metal stack with adhesion layer, barrier layer, and seed or wetting layer. The adhesion layer is formed over conductive layer 174 and can be Ti, TiN, TiW, Al, or Cr. The barrier layer is formed over the adhesion layer and can be Ni, NiV, Pt, Pd, TiW, or CrCu. The barrier layer inhibits the diffusion of Cu into the active area of the die. The seed layer is formed over the barrier layer and can be Cu, Ni, NiV, Au, or Al. UBMs 178 provide a low resistive interconnect to conductive layer 174, as well as a barrier to solder diffusion and seed layer for solder wettability.

Figure 7:
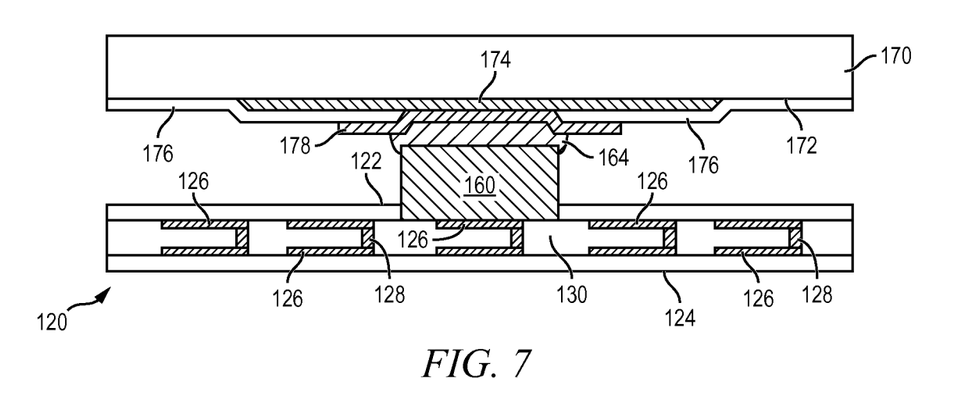
FIG. 7 illustrates the semiconductor die bonded to the bump formed on the substrate.

Note that semiconductor die 170 has no conductive pillar or bump formed on UBM 178, as described in the background. Instead, using the process and structure described in FIGS. 6a-6e, conductive pillar 160 and bump 164 are formed over substrate 120 and provide the electrical interconnect needed to bond semiconductor die 170 to the substrate. UBM 178 is aligned with bump 164 to mount semiconductor die 170 to substrate 120. UBM 178 is brought into contact with bump 164 and reflowed to metallurgically and electrically connect the UBM to the bump. FIG. 7 shows semiconductor die 170 mounted to substrate 120 with UBM 178 bonded to bump 164. Since semiconductor die 170 is mounted to substrate 120 without forming bumps on the wafer or die, i.e., without subjecting the wafer to thermal stress during reflow, the ELK ILD delamination or damage around the bump area of the wafer or die is avoided.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate including an insulating material;
   forming an opening partially into the insulating material;
   forming an interconnect structure over the substrate including a non-fusible portion extending into the opening in the insulating material; and
   disposing a semiconductor die over the substrate and electrically connected to the interconnect structure.

2. The method of claim 1, wherein the interconnect structure includes a fusible portion disposed over the non-fusible portion opposite the substrate.

3. The method of claim 1, further including disposing a bump material over the interconnect structure.

4. The method of claim 1, wherein the interconnect structure includes a conductive pillar or stacked bumps.

5. The method of claim 1, wherein the semiconductor die includes a flipchip type semiconductor die.

6. A method of making a semiconductor device, comprising:
   providing a substrate including an insulating material;
   forming an opening into the insulating material; and
   forming an interconnect structure over the substrate including a non-fusible portion extending into the opening in the insulating material and a fusible portion disposed over the non-fusible portion opposite the substrate.

7. The method of claim 6, further including disposing a semiconductor die over the substrate and electrically connected to the interconnect structure.

8. The method of claim 7, further including:
   forming a first conductive layer over a surface of the semiconductor die;
   forming an insulating layer over the first conductive layer and the surface of the semiconductor die; and
   forming a second conductive layer over the first conductive layer.

9. The method of claim 6, further including disposing a bump material over the interconnect structure.

10. The method of claim 6, wherein the interconnect structure includes a conductive pillar or stacked bumps.

11. A semiconductor device, comprising:
    a substrate including an insulating material with an opening formed partially into the insulating material; and
    an interconnect structure formed on the substrate including a non-fusible portion extending into the opening of the insulating material and a fusible portion disposed over the non-fusible portion opposite the substrate.

12. The semiconductor device of claim 11, further including a semiconductor die disposed over the substrate and electrically connected to the interconnect structure.

13. The semiconductor device of claim 12, further including:
    a first conductive layer formed over a surface of the semiconductor die;
    an insulating layer formed over the first conductive layer and the surface of the semiconductor die; and
    a second conductive layer formed over the first conductive layer.

14. The semiconductor device of claim 12, wherein the semiconductor die includes a flipchip type semiconductor die.

15. The semiconductor device of claim 11, wherein the interconnect structure includes a conductive pillar or stacked bumps.

16. The semiconductor device of claim 11, wherein the substrate includes a conductive layer electrically connected to the interconnect structure.

17. A semiconductor device, comprising:
    a substrate including an insulating material with an opening formed partially into the insulating material; and
    a conductive pillar disposed over the substrate and extending into the opening in the insulating material.

18. The semiconductor device of claim 17, further including a semiconductor die disposed over the substrate and electrically connected to the conductive pillar.

19. The semiconductor device of claim 18, further including:

a first conductive layer formed over a surface of the semiconductor die;
an insulating layer formed over the first conductive layer and the surface of the semiconductor die; and
a second conductive layer formed over the first conductive layer.

20. The semiconductor device of claim 18, wherein the semiconductor die includes a flipchip type semiconductor die.

21. The semiconductor device of claim 17, further including a fusible material formed over the conductive pillar.

22. The semiconductor device of claim 17, further including a bump material disposed over the conductive pillar.

23. The semiconductor device of claim 17, wherein the substrate includes a conductive layer electrically connected to the conductive pillar.

24. A semiconductor device comprising:
a substrate including an insulating material with an opening formed into the insulating material;
an interconnect structure formed over the substrate including a non-fusible portion extending into the opening in the insulating material; and
a semiconductor die disposed over the substrate and electrically connected to the interconnect structure.

25. The semiconductor device of claim 24, wherein the interconnect structure includes a fusible portion disposed over the non-fusible portion opposite the substrate.

26. The semiconductor device of claim 24, further including a bump material disposed over the interconnect structure.

27. The semiconductor device of claim 24, wherein the interconnect structure includes a conductive pillar or stacked bumps.

28. The semiconductor device of claim 24, wherein the semiconductor die includes a flipchip type semiconductor die.

29. The semiconductor device of claim 24, wherein the substrate includes a conductive layer electrically connected to the interconnect structure.

* * * * *